(12) United States Patent
Ma et al.

(10) Patent No.: US 8,912,070 B2
(45) Date of Patent: Dec. 16, 2014

(54) METHOD FOR MANUFACTURING SEMICONDUCTOR DEVICE

(71) Applicants: Xiaolong Ma, Beijing (CN); Huaxiang Yin, Beijing (CN); Zuozhen Fu, Beijing (CN)

(72) Inventors: Xiaolong Ma, Beijing (CN); Huaxiang Yin, Beijing (CN); Zuozhen Fu, Beijing (CN)

(73) Assignee: The Institute of Microelectronics Chinese Academy of Science, Beijing (CN)

( * ) Notice: Subject to any disclaimer, the term of this patent is extended or adjusted under 35 U.S.C. 154(b) by 0 days.

(21) Appl. No.: 13/812,500

(22) PCT Filed: Oct. 12, 2012

(86) PCT No.: PCT/CN2012/001377
§ 371 (c)(1),
(2), (4) Date: Jan. 26, 2013

(87) PCT Pub. No.: WO2014/026306
PCT Pub. Date: Feb. 20, 2014

(65) Prior Publication Data
US 2014/0048765 A1    Feb. 20, 2014

(30) Foreign Application Priority Data

Aug. 16, 2012  (CN) .......................... 2012 1 0293525

(51) Int. Cl.
*H01L 27/108*    (2006.01)
(52) U.S. Cl.
USPC ........... 438/301; 438/272; 438/274; 438/305; 438/507

(58) Field of Classification Search
USPC ................ 438/197–199, 259, 301–305, 507; 257/213, 288, 327, 396, 411, E27.06, 257/E29.255
See application file for complete search history.

(56) References Cited

U.S. PATENT DOCUMENTS

| | | | |
|---|---|---|---|
| 7,960,798 B2 * | 6/2011 | Luo et al. .................... | 257/396 |
| 8,048,750 B2 | 11/2011 | Wu et al. | |
| 8,264,032 B2 * | 9/2012 | Yeh et al. .................... | 257/327 |
| 2007/0032026 A1 * | 2/2007 | Ong et al. .................... | 438/301 |
| 2011/0068407 A1 * | 3/2011 | Yeh et al. .................... | 257/369 |
| 2012/0241875 A1 * | 9/2012 | Tezuka ......................... | 257/411 |
| 2013/0049101 A1 * | 2/2013 | Hsiao et al. ................... | 257/329 |

OTHER PUBLICATIONS

Loo, R et al High Quality Ge Virtual Substrates on Si Wafers—with Standard STI Patterning. J. Electrochem. Soc. 2010, vol. 157. Issue 1, p. H13-H21.

(Continued)

*Primary Examiner* — Dung A. Le
(74) *Attorney, Agent, or Firm* — Treasure IP Group, LLC

(57) ABSTRACT

The present invention discloses a method for manufacturing a semiconductor device, comprising: forming a gate stack structure on a substrate; forming a drain region in the substrate on one side of the gate stack structure; and forming a source region made of GeSn in the substrate on the other side of the gate stack structure; wherein the forming the source region made of GeSn comprises: implanting precursors in the substrate on the other side of the gate stack structure; and performing a laser rapid annealing such that the precursors react to produce GeSn alloy, thereby to constitute a source region; and wherein the step of implanting precursors further comprises: performing a pre-amorphization ion implantation, so as to form an amorphized region in the substrate; and implanting Sn in the amorphized region.

9 Claims, 2 Drawing Sheets

(56) References Cited

OTHER PUBLICATIONS

Wang, G. H. et al Silicon-Germanium-Tin (SiGeSn) Source and Drain Stressors fonned by Sn Implant and Laser Annealing for Strained Silicon-Gennanium Channel P-MOSFETs. Electron Devices Meeting, 2007, p. 131-134.

Takeuchi, S.et al Gex-Snx Stressors for Strained-Ge CMOS. Solid-State Electronics. 2011, vol. 60, p. 53-57.

Vincent, B. Characterization of GeSn materials for future Ge pMOSFETs source/drain stressors. Microelectronic Engineering. 2011, vol. 88, Issue 4, p. 342-346.

* cited by examiner

US 8,912,070 B2

METHOD FOR MANUFACTURING SEMICONDUCTOR DEVICE

CROSS REFERENCE

This application is a National Phase application of, and claims priority to, PCT Application No. PCT/CN2012/001377, filed on Oct. 12, 2012, entitled 'SEMICONDUCTOR DEVICE AND METHOD FOR MANUFACTURING THE SAME', which claimed priority to Chinese Application No. CN 201210293525.X, filed on Aug. 16, 2012. Both the PCT Application and Chinese Application are incorporated herein by reference in their entireties.

FIELD OF THE INVENTION

The present invention relates to the field of manufacturing of a semiconductor integrated circuit, in particular, to a tunnel field-effect transistor (TFET) with GeSn alloy as the source and a method for manufacturing the same.

BACKGROUND OF THE INVENTION

With the on-going development of the integrated circuit technology, particularly the continuous reduction of the device size in scale, various key parameters of the device such as the threshold voltage are also reduced accordingly, the advantages of reduction in the power consumption and increase in the integration can promote the enhancement of the overall performance of the device. However, at the same time, the device drive capability is limited by the traditional technology of silicon material, the carrier mobility is low, thus a problem of a relatively low device drive capability is confronted with. Accordingly, the high mobility channel device finds a very important application prospect in the future.

For existing high mobility channel devices, generally $Si_{1-x}Ge_x$ or $Si_{1-x}C_x$ is adopted as a stressed source/drain region for applying a stress to the Si channel region, or these materials are directly adopted as the substrate and the channel region. The hole mobility may be further enhanced by introducing a compressive strain into $Si_{1-x}Ge_x$, and correspondingly the electron mobility may be further enhanced by introducing a tensile strain into $Si_{1-x}C_x$. However, the lattice constants of the two materials are not sufficiently different from that of Si, they can only provide a limited strain, thus can hardly be applied to the device requiring a higher driving capability.

One alternative material is a GeSn alloy, the thin film thereof has a high carrier mobility, and the band structure of the alloy can be adjusted by adjusting the concentration of Sn, thus the material is widely applied to advanced CMOS devices and photoelectronic devices.

However, it need molecular-beam epitaxy or CVD to form the traditional GeSn alloy, which is still not mature or not compatible with CMOS currently. Besides, since Sn has a very low equilibrium solid solubility in Ge, it is difficult to obtain the $Ge_{1-x}Sn_x$ with the concentration of Sn higher than 1% by conventional processes.

In addition, other high mobility materials such as GaAs and InSb also have the same problem and can hardly be compatible with the Si-based CMOS process.

On another hand, with the decrease in the channel length of a conventional MOSFET, the leakage current will increase accordingly. Particularly in the technology below 30 nm, the device leakage current is significantly increased, causing the power consumption of the entire device to increase unstoppably. One way to reduce the device power consumption is to adopt a new type of tunnel field-effect transistor (TFET) structure, wherein, by adding a tunnel dielectric layer between the source and the channel region, the leakage current is effectively decreased, and the chip power consumption is greatly reduced. However, when the size is continuously reduced to below 22 nm, the existing common TFET drive current is 3-4 orders of magnitude lower than the conventional MOSFET drive current, rendering that reduction in the power consumption and increase in the drive capability can not be balanced, and the overall performance of the device can only have a limited increase.

SUMMARY OF THE INVENTION

Accordingly, the present invention aims to provide a tunnel field-effect transistor (TFET) having a GeSn stressed region and method for manufacturing the same, thereby to overcome the defects in traditional technology and enhance the on-state current Ion and the on/off current ratio Ion/Ioff of TFET effectively, that is, increasing the drive capability while reducing the power consumption at the same time.

The object of the present invention is realized by providing a semiconductor device, comprising: a substrate, a gate stack structure on the substrate, source and drain regions in the substrate on both sides of the gate stack structure, and a channel region between the source and drain regions in the substrate, characterized in that the source region in the source and drain regions comprises a GeSn alloy, and a tunnel dielectric layer is optionally comprised between the GeSn alloy of the source region and the channel region.

Wherein the channel region comprises Si and/or SiGe.

Wherein the forbidden bandwidth of GeSn alloy is adjusted by controlling the concentration of Sn.

Wherein the concentration of Sn in the GeSn alloy is greater than 0 and less than 30%.

Wherein, optionally the source and drain regions further comprise raised source and drain regions made of the same material thereon.

Wherein, optionally the tunnel dielectric layer comprises one of silicon oxide, silicon nitride, silicon oxynitride and high-K materials or combinations thereof.

Wherein the source and drain regions further comprise a metalized source/drain contact layer.

Wherein the conductivity type of the source region is different from that of the drain region, and the channel region is intrinsically undoped.

Furthermore, the present invention also provides a method for manufacturing a semiconductor device, comprising: forming a gate stack structure on a substrate; forming a drain region in the substrate on one side of the gate stack structure; and forming a source region made of GeSn in the substrate on the other side of the gate stack structure.

Wherein the forbidden bandwidth of the GeSn alloy is adjusted by controlling the concentration of Sn.

Wherein the concentration of Sn in the GeSn alloy is greater than 0 and less than 30%.

Wherein the method for forming a source region made of GeSn comprises: performing etching to the substrate of the source region, and performing selective epitaxial growth and deposition of GeSn alloy.

Wherein the method for forming a source region made of GeSn comprises: implanting precursors in the substrate on the other side of the gate stack structure; and performing a laser rapid annealing such that the precursors react to produce GeSn alloy, thereby to constitute a source region.

Wherein the step of implanting precursors further comprises: performing a pre-amorphization ion implantation, so as to form an amorphized region in the substrate; and implanting Sn in the amorphized region.

Wherein the ions used for the pre-amorphization ion implantation include one of Ge, B, Ga and In or combinations thereof.

Wherein the implantation dose of Sn is $1\times10^{15}$-$1\times10^{17}$ cm$^{-2}$.

Wherein after implanting the precursors and before performing the laser rapid annealing, the method further comprises forming a protective layer over the precursors.

Wherein the single laser pulse time in the laser rapid annealing process is 1 ns-1 us, the pulse number is 1-100, and the energy density is 100 mJ/cm$^2$-1 J/cm$^2$.

Wherein, optionally a tunnel dielectric layer is formed between the source region and the channel, and the forming step comprises: performing etching to the substrate on the other side of the gate stack structure to form a source trench, depositing a tunnel dielectric thin film in the source trench, and forming a GeSn alloy on the tunnel dielectric thin film to form a source region.

In accordance with the semiconductor device and method for manufacturing the same of the present invention, a GeSn alloy having a narrow band gap is formed by implanting precursors and then performing a laser rapid annealing, so that the on-state current of TFET is effectively enhanced, accordingly it has an important application prospect in a high performance low power consumption application.

BRIEF DESCRIPTION OF THE DRAWINGS

The technical solution of the present invention will be described in detail with reference to the drawings below, wherein.

DETAILED DESCRIPTION OF THE EMBODIMENTS

The features and the technical effects of the technical solution of the present application will be described in detail in combination with the illustrative embodiments with reference to the drawings. It should be pointed out that like reference signs indicate like structures, the terms such as "first", "second", "above", "below", "thickness" and "thin" used in the present invention may be used to describe various device structures. Except for specific explanations, these descriptions do not imply the spatial, sequential or hierarchical relationships of the structures of the described device.

Figure 1:
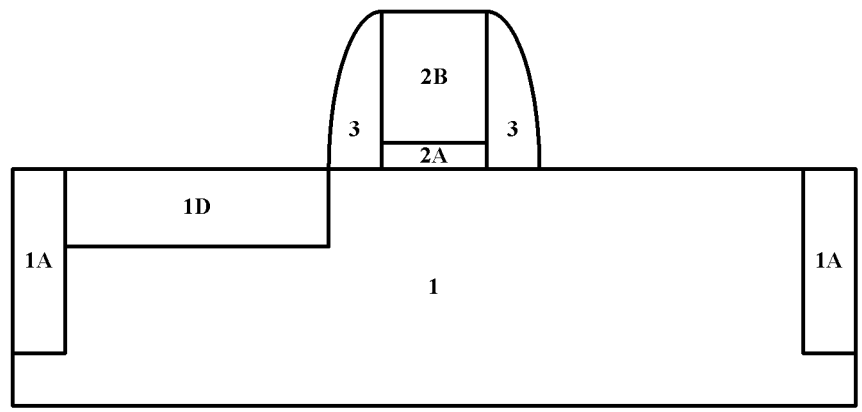
FIGS. 1-3 are diagrammatic cross-sections corresponding to the steps of the method for manufacturing a semiconductor device in accordance with a first embodiment of the present invention.
Figure 2:
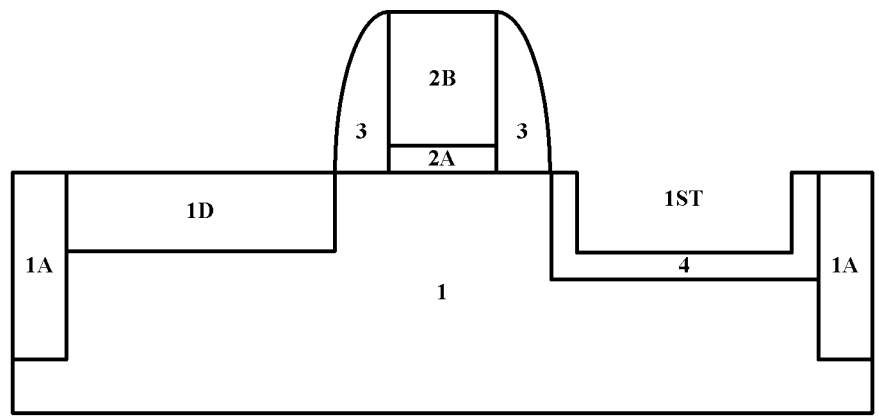
Figure 3:
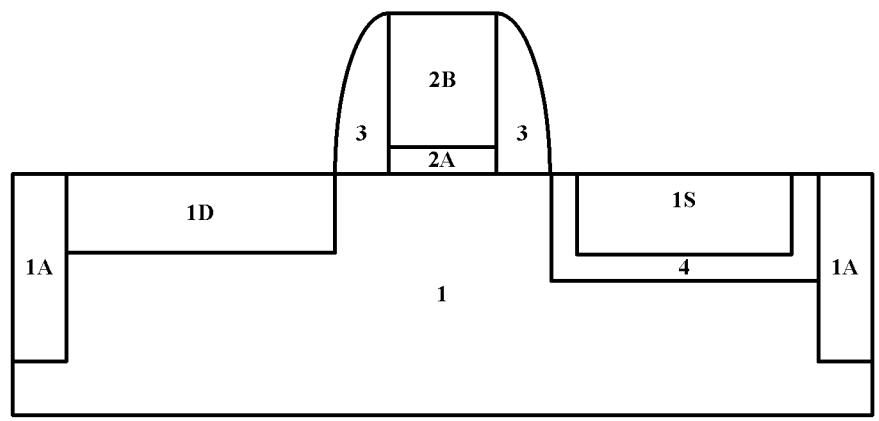

In accordance with a first embodiment of the present invention, referring to FIGS. 1 to 3, a conventional MOSFET device structure having a GeSn stressed source/drain region is formed.

First, referring to FIG. 1, a gate stack structure 2 and a gate spacer 3 are formed on a substrate 1, and a drain region 1D is formed by implantation in the substrate 1 at one side of the gate stack structure 2.

A substrate 1 is provided. The substrate may either be bulk Si, SOI, bulk Ge, GeOI, SiGe and GeSb, or be III-V group or II-VI group compound semiconductor substrate such as GaAs, GaN, InP and InSb. Furthermore, the substrate may also be a transparent substrate such as glass, plastic, and resin. In order to be compatible with the existing CMOS technology so as to be applied to manufacturing of large-scale digital integrated circuit, the substrate 1 is preferably made of bulk Si (monocrystalline silicon wafer) or SOI wafer.

Etching is first performed in the substrate 1 to form a shallow trench, then oxide (e.g., silicon oxide) is deposited in the shallow trench by a conventional process such as rapid thermal oxidation (RTO), LPCVD, PECVD, and HDPCVD to form shallow trench isolations (STIs) 1A. The substrate region enclosed by the STIs 1A forms the active region of the device.

Preferably, a buried layer (not shown) is formed in the active region enclosed by the STIs 1A for enhancing the stress applied by the source/drain region to the channel region or enhancing the stress of the channel region per se, thereby to further enhance the carrier mobility. The buried layer is made of a material whose lattice constant is between that of the Si substrate and that of GeSn of the subsequent source/drain region, e.g., SiGe. The buried layer may be formed by a process of optionally depositing a buffer layer on the substrate 1, epitaxially growing a SiGe buried layer on the substrate/buffer layer, and optionally epitaxially growing Si or Ge top layer over the buried layer. Furthermore, the buried layer may also be formed by a process of implanting Ge ions into Si substrate to a certain depth, then performing annealing such that the implanted doping ions react with the substrate to form a SiGe buried layer. The distance between the burrier layer and the surface of the substrate 1, i.e., the depth of the buried layer may be set by controlling the epitaxial or implanting process parameters depending on the requirement of stress distribution in the channel region, and the depth of the buried layer may be, e.g., about 10-30 nm.

A gate insulating layer 2A and a gate conductive layer 2B are sequentially deposited on the substrate 1 by a conventional process such as LPCVD, PECVD, HDPCVD, MOCVD, MBE, ALD, evaporation, and sputtering and then are etched to form a gate stack structure 2A/2B. In a gate first process, the gate stack structure will be kept all the time. The gate insulating layer 2A is made of a high-K material including but not limited to nitride (e.g., SiN, AlN, TiN), metal oxide (mainly including oxide of subgroup and lanthanide metal element such as $Al_2O_3$, $Ta_2O_5$, $TiO_2$, $ZnO$, $ZrO_2$, $HfO_2$, $CeO_2$, $Y_2O_3$, $La_2O_3$), perovskite phase oxide (e.g., $PbZr_xTi_{1-x}O_3$ (PZT), $Ba_xSr_{1-x}TiO_3$ (BST)); the gate conductive layer 2B is metal and/or metal nitride, wherein the metal comprises Al, Ti, Cu, Mo, W, and Ta, and the metal nitride comprises TiN and TaN. In a gate last process, the gate stack structure is a dummy gate stack structure, which will be removed, in the subsequent process. The gate insulating layer 2A comprises silicon oxide and silicon oxynitride. The gate conductive layer 2B is polysilicon or amorphous silicon. The layer 2A may have a thickness of e.g., about 1-5 nm, and the layer 2B may have a thickness of e.g., about 10-100 nm.

Preferably, a dielectric material such as silicon nitride, silicon oxynitride and amorphous diamond like carbon (DLC) is deposited on the substrate 1 and the gate stack structure 2A/2B by a conventional process such as PECVD and HDPCVD and etched to form a gate spacer 3.

Drain ion implantation is performed to form a drain region 1D having a first doping type in the substrate 1 at one side (either the left side or the right side) of the gate stack structure 2A/2B. The drain region 1D is, for example, a n+ drain region.

The type of the doping ions may be P, As and N etc., and the doping dose and implantation energy may be reasonably set depending on the control of the junction depth and the requirement of the doping concentration.

Optionally, referring to FIG. 2, a tunnel dielectric layer is formed between the source region and the substrate (channel). The forming step comprises: etching the source region, and depositing a tunnel dielectric thin film. Specifically, photolithography/etching is performed on the substrate 1 at the other side of the gate stack structure 2 to form a source trench 1ST. A tunnel dielectric layer 4 is deposited in the source trench 1ST by a process such as LPCVD, PECVD, HDPCVD, MBE, and ALD, the material thereof may be one of silicon oxide, silicon nitride, silicon oxynitride, high-K materials or combinations thereof, preferably a laminated structure of the above materials. The thickness of the tunnel dielectric layer 4 may be determined depending on the requirement of the device performance, e.g., about 1-10 nm.

Figure 4A:
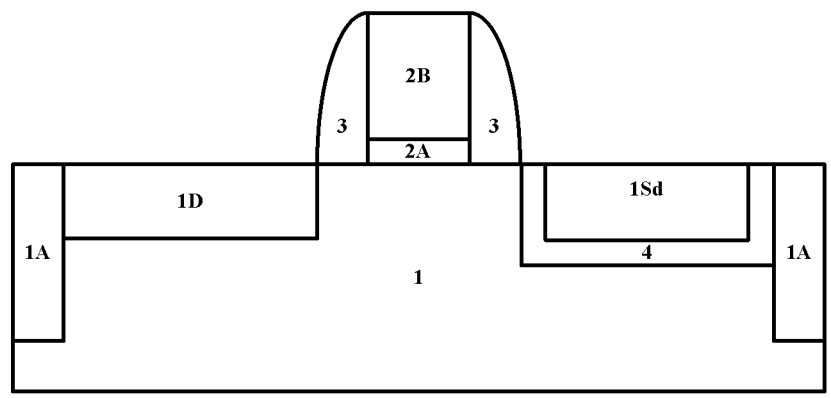
FIGS. 4A and 4B are diagrammatic cross-sections corresponding to the steps of the method for manufacturing a semiconductor device in accordance with a second embodiment of the present invention.
Figure 4B:
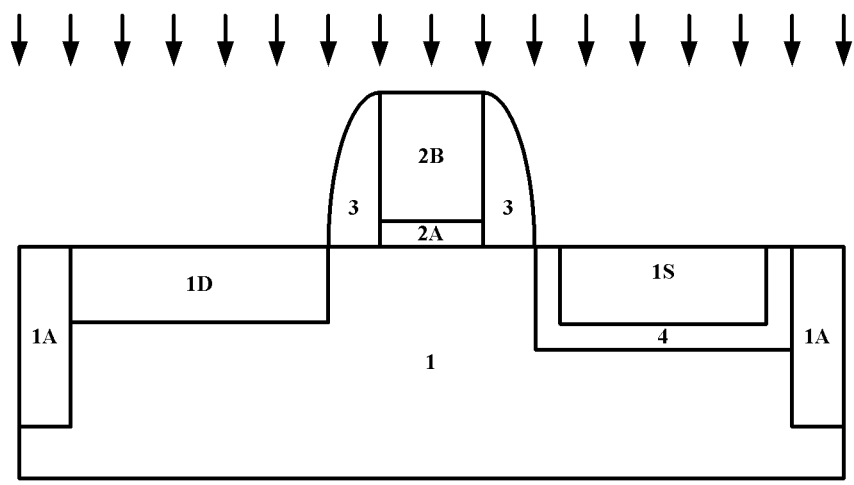

Referring to FIG. 3 and FIGS. 4A to 4B, a source region 1S is formed.

FIG. 3 corresponds to an embodiment of the present invention, wherein selective epitaxial growth of GeSn alloy is performed to form the source region 1S. In the step, the source region 1S is epitaxially grown in the source trench 1ST by a process such as PECVD, HDPCVD, MBE and ALD, and the precursors thereof at least comprise elements Ge and Sn, and the formed source region 1S is made of a material of GeSn alloy. The thickness of the alloy layer and the concentration of Sn in $Ge_{1-x}Sn_x$ (the atomic percent) may be controlled by controlling the process parameters including the flow rate ratio of the precursors (e.g., feed gas and solid) as well as the pressure and temperature in the reaction chamber. Preferably, the concentration of Sn in $Ge_{1-x}Sn_x$ (the atomic percent) satisfies: $0<x<0.3$. Preferably, an in situ doping is simultaneously performed when GeSn alloy is epitaxially grown such that the source region 1S has a second doping type, which is different from that of the drain region 1D, e.g., p+. Correspondingly, when substrate 1 is provided (to form a channel region), it may be an undoped intrinsic substrate 1 or a lightly doped substrate having a second doping type, e.g., p−.

FIG. 4A and FIG. 4B illustrate another embodiment of the present invention, wherein precursors (FIG. 4A) are implanted and performed a laser annealing processing (FIG. 4B) to form a source region 1S made of GeSn alloy. First, a material such as Si and SiGe which is the same as that of the substrate 1 is epitaxially grown or deposited by CVD in the source trench 1ST, to be used as the base material for the source region. The deposition may be performed by a process such as PECVD, HDPCVD, MBE, and ALD. A doping implantation is performed by taking the gate spacer 3 as a mask, implanting precursors in the source region 1S at one side of the gate spacer 3 to form a doped region 1Sd of the precursors.

First, a pre-amorphization ion implantation (PAI) is performed, the implantation energy is, e.g., about 10-200 KeV, and the implantation dose is, e.g., about $1\times10^{15}$-$1\times10^{17}$ $cm^{-2}$. When the substrate 1 and the base material 1S for the source region are Si, the implanted ions are Ge. The implanted ions Ge destroy the lattice of certain areas within the surface of the substrate 1 and the base material 1S for the source region which are to form the drain region and source region respectively (e.g., within a distance of about 10-20 nm from the surface), so as to amorphize the lattice to form an amorphized region (not shown), facilitating further ion implantation later and formation of an alloy by reaction when annealing is performed.

Preferably, before and/or after the pre-amorphization ion implantation, impurity ions such as B, Ga and In are further implanted in the amorphized region to adjust the conductivity type and concentration of implanted ions of the source/drain region.

Furthermore, when the substrate 1 and the base material 1S for the source region are made of SiGe or Si containing a SiGe buried layer (that is, the substrate per se contains Ge), the amorphized implanted ions are impurity ions such as B, Ga and In, and the conductivity type and concentration of implanted ions of the source/drain region are adjusted while performing amorphization, thus no more extra adjustment of the conductivity type and concentration of implanted ions of the source/drain region need to be performed.

After performing the pre-amorphization ion implantation, Sn is implanted in the amorphized region. The implantation energy is, e.g., about 20-200 KeV, and the implantation dose is, e.g., about $1\times10^{15}$-$1\times10^{17}$ $cm^{-2}$ and preferably $1\times10^{16}$ $cm^{-2}$. Till now, the amorphized region comprises at least two kinds of doping ions Ge and Sn which are to be used as the precursors, to thereby form a doping region 1Sd of the precursors.

Moreover, the impurity ions such as B, Ga and In may also be implanted after implanting Sn.

Preferably, a protective layer (not shown) is formed over the doping region 1Sd of the precursors. For example, a low-temperature protective layer is formed by using a process such as PECVD and LPCVD and decreasing the deposition temperature, that is to say, the protective layer, e.g., low temperature silicon oxide (LTO), is deposited in a low temperature. The deposition is performed at a temperature, e.g., lower than 400° C. to avoid that Ge and Sn react in advance. Alternatively, the protective layer may be formed by a process such as spin coating, screen printing and spraying using glass materials such as PSG and BPSG or even resin materials such as photoresist for avoiding damage to materials in the event of the subsequent excessive laser processing. Of course, if the laser processing parameters can be well adjusted, the protective layer may also be omitted.

Then, referring to FIG. 4B, a laser rapid annealing is performed such that the Ge and Sn in the doping region 1Sd of the precursors react to produce GeSn, to thereby form the source region 1S of the GeSn. A laser pulse is adopted to irradiate the doping region 1Sd of the precursors such that the temperature rises quickly at the surface of the doping region 1Sd containing at least two precursors of Ge and Sn which melt, react, then crystallize in a crystal orientation similar to that of the substrate 1 and/or SiGe buried layer during the cooling process, and finally form $Ge_{1-x}Sn_x$ alloy. The alloy has a lattice constant greater than that of the material of the channel, which introduces a compressive strain along a carrier transport direction, to enhance the carrier mobility. Besides, GeSn alloy may also reduce the source/drain contact resistance of the device. The single laser pulse time in the laser rapid annealing process is about 1 ns-1 us, the pulse number is about 1-100, and the energy density is about 100 $mJ/cm^2$-1 $J/cm^2$. The thickness of the alloy layer and the concentration of Sn in $Ge_{1-x}Sn_x$ (the atomic percent) may be controlled by adjusting the above laser pulse parameters. Preferably, $0<x<0.3$.

Figure 5:
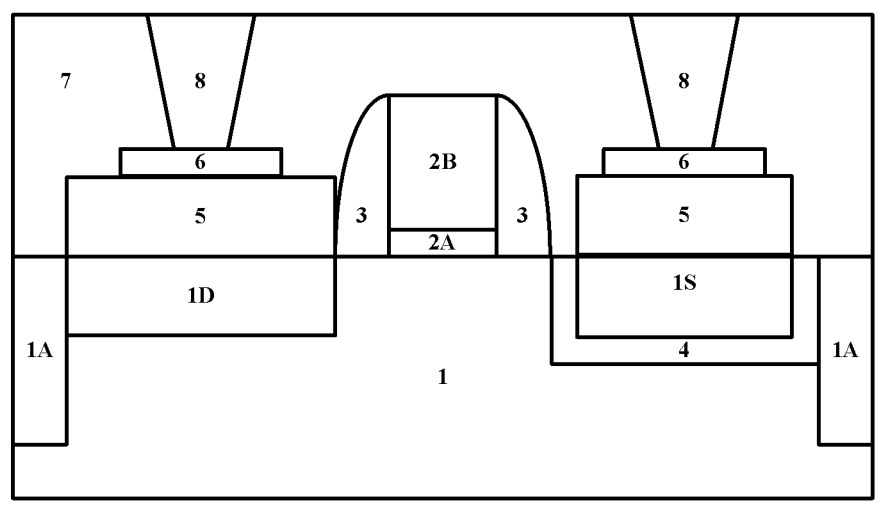
FIG. 5 is a diagrammatic cross-section of a semiconductor device finally manufactured in accordance with the present invention.

Thereafter, referring to FIG. 5, the conventional gate first or gate last process may be continuously used to complete the manufacturing of MOSFET. For example, a homogeneous/heterogeneous raised source/drain region 5 made of a high mobility material is epitaxially grown again in the source/drain region 1S/1D, to form a source/drain metalized contact layer 6 made of a metal silicide or a metal germanide on the GeSn source 1S/drain region 1D/5, to further reduce source/drain contact resistance. An interlayer dielectric layer (ILD) 7 of a low-K material is deposited on the entire device. The ILD 7 is etched to form source/drain contact holes until the source/drain metalized contact layer 6 is exposed, and metal such as W, Cu, Al and Mo or metal nitride such as TiN and TaN is deposited in the contact holes to form source/drain contact plugs 8. It shall be noted that although in the structure shown in FIG. 5 the gate stack structure comprises gate insulating layer 2A and the gate conductive layer 2B laminated in parallel, as in the case of a gate first process, it may also be applicable to a gate last process, that is, the gate insulating layer 2A encloses the bottom and sides (not shown in FIG. 5) of the gate conductive layer 2B in the gate trench.

Accordingly, the semiconductor device in accordance with the first embodiment of the present invention comprises a substrate, a gate stack structure on the substrate, source and drain regions in the substrate on both sides of the gate stack structure, and a channel region between the source and drain regions in the substrate, characterized in that the source region in the source and drain regions comprises a GeSn alloy, and a tunnel dielectric layer is optionally comprised between the GeSn alloy of the source region and the channel region. Furthermore, the channel region comprises Si or SiGe.

In accordance with the semiconductor device and method for manufacturing the same of the present invention, GeSn alloy having a narrow band gap is formed by implanting precursors and performing a laser rapid annealing, the on-state current of TFET is effectively enhanced, accordingly it has an important application prospect in a high performance low power consumption application.

Although the present invention has been described with reference to one or more illustrative embodiments, it may be appreciated by those skilled in the art that various appropriate modifications and equivalents can be made to the method for forming the device structure without departing from the scope of the present invention. Besides, many modifications adaptable to specific situations or materials can be made under the disclosed teaching without departing from the scope of the present invention. Therefore, it is not intended to limit the present invention to the specific embodiments which are disclosed as the preferred embodiments for implementing the present invention, the disclosed device structure and the manufacturing method thereof will include all the embodiments that come within the scope of the present invention.

What is claimed is:

1. A method for manufacturing a semiconductor device, comprising:
   forming a gate stack structure on a substrate;
   forming a drain region in the substrate on one side of the gate stack structure; and
   forming a source region made of GeSn in the substrate on the other side of the gate stack structure;
   wherein the forming the source region made of GeSn comprises: implanting precursors in the substrate on the other side of the gate stack structure; and performing a laser rapid annealing such that the precursors react to produce GeSn alloy, thereby to constitute a source region; and
   wherein the step of implanting precursors further comprises: performing a pre-amorphization ion implantation, so as to form an amorphized region in the substrate; and implanting Sn in the amorphized region.

2. The method for manufacturing a semiconductor device according to claim 1, wherein the forbidden band width of the GeSn alloy is adjusted by changing the concentration of Sn.

3. The method for manufacturing a semiconductor device according to claim 2, wherein the concentration of Sn in the GeSn alloy is more than 0 and less than 30%.

4. The method for manufacturing a semiconductor device according to claim 1, wherein the method for forming a source region made of a GeSn comprises: performing etching to the substrate of the source region, and performing selective epitaxial growth and deposition of the GeSn alloy.

5. The method for manufacturing a semiconductor device according to claim 1, wherein the ions used for the pre-amorphization ion implantation include one of Ge, B, Ga and In or combinations thereof.

6. The method for manufacturing a semiconductor device according to claim 1, wherein the implantation dose of Sn is $1\times10^{15}$-$1\times10^{17}$ cm$^{-2}$.

7. The method for manufacturing a semiconductor device according to claim 1, wherein after implanting the precursors and before performing the laser rapid annealing, the method further comprises forming a protective layer over the precursors.

8. The method for manufacturing a semiconductor device according to claim 1, wherein the single laser pulse time in the laser rapid annealing process is 1 ns-1 us, the pulse number is 1-100, and the energy density is 100 mJ/cm$^2$-1 J/cm$^2$.

9. The method for manufacturing a semiconductor device according to claim 1, wherein-a tunnel dielectric layer is formed between the source region and the channel, and the forming step comprises: performing etching to the substrate on the other side of the gate stack structure to form a source trench, depositing a tunnel dielectric thin film in the source trench, and forming the GeSn alloy on the tunnel dielectric thin film to form a source region.

* * * * *